United States Patent [19]
Ohshima

[11] Patent Number: 5,291,387
[45] Date of Patent: Mar. 1, 1994

[54] SWITCHING VOLTAGE REGULATOR WITH PROTECTIVE DEVICE AGAINST THERMAL BREAKDOWN

[75] Inventor: Yoshinobu Ohshima, Tokyo, Japan

[73] Assignee: NEC Corporation, Tokyo, Japan

[21] Appl. No.: 847,623

[22] Filed: Mar. 6, 1992

[30] Foreign Application Priority Data

Mar. 13, 1991 [JP] Japan .................................. 3-47162

[51] Int. Cl.$^5$ .................................................. H02H 7/122
[52] U.S. Cl. .......................................... 363/56; 363/21; 363/57; 323/281; 323/907; 361/18; 361/103
[58] Field of Search .................. 363/20, 21, 24, 25, 363/55, 56, 57, 58, 97; 361/18, 25, 26, 27, 103; 323/281, 907

[56] References Cited

U.S. PATENT DOCUMENTS

| | | | |
|---|---|---|---|
| 4,727,450 | 2/1988 | Fachinetti et al. | 361/103 |
| 5,008,771 | 4/1991 | Palara | 361/103 |
| 5,021,620 | 6/1991 | Inumada | 363/21 X |
| 5,073,838 | 12/1991 | Ames | 361/103 |
| 5,115,388 | 5/1992 | Shigekane | 363/56 |

*Primary Examiner*—Emanuel T. Voeltz
*Attorney, Agent, or Firm*—Laff, Whitesel, Conte & Saret

[57] ABSTRACT

A switching-type voltage regulator of this invention comprises a voltage control section for generating a stabilized voltage by controlling a voltage supply period from input side to output side, and a protective device. The protective device monitors the temperature of a certain component part or parts of the voltage control section and convert the temperature into a voltage to compare with the reference voltage generated by a reference voltage source, and brings the output of the voltage control section to a halt in accordance with the result of comparison. The output of the voltage control section is brought to a halt regardless of the presence of output abnormalcy when the temperature of the component part or parts monitored exceeds a certain level. As the monitoring means, it is preferable to utilize the electrical characteristic of semiconductor p-n junction changing with temperature, and a semiconductor diode is more preferable. A preferable halting means is a 2-input AND circuit where a signal representing the result of the comparing means are inputted into one of the input terminals, and a switching control signal to the other to control a switching element. Preferably, a latching means is installed between the comparing means and halting means to maintain a halted condition.

15 Claims, 3 Drawing Sheets

SWITCHING VOLTAGE REGULATOR WITH PROTECTIVE DEVICE AGAINST THERMAL BREAKDOWN

BACKGROUND OF THE INVENTION

1. Field of the Invention

This invention relates to a switching voltage regulator having a protective device of a switching element for controlling the output thereof from thermal breakdown.

2. Description of the Prior Art

FIG. 1 shows an exemplified block diagram of a conventional switching regulator generating a stabilized power supply voltage. The regulator in FIG. 1 is supplied with a non-stabilized voltage from an input voltage source 1 on the primary side and provided with a transformer 2 which produces a signal for detecting a primary-side overcurrent, an output transformer 3 which divides the secondary side from the primary side, two diodes 4 which rectify a full-wave current at the secondary side, a choking coil 5 and a capacitor 6 which smooth the secondary-side current, and a MOS transistor 7 which controls a primary-side current by switching. A control circuit 8 detects deviation from a set voltage, and modulates the pulse width of the primary-side current in accordance with the deviation. Thus the control circuit 8 controls the output voltage at the output tereminal by means of a change in the on-off interval of the switching transistor 7. The control circuit 8 also detects an excessively high or low output voltage by way of a control processor 9, and further detects the primary-side overcurrent with the transformer 2, and thereby controls the primary-side current in a similar manner in accordance with the detected results. The control processor 9 receives the output voltage to monitor as well as to keep the switching transistor 7 turn-off. Numeral 10 shows an output terminal.

In this way, the switching-type voltage regulator in FIG. 1 is protected by detecting any abnormal output voltage with the control processor 9 and/or the control circuit 8 to thereby turn off the switching transistor 7 to bring the power supply output to a halt. Hence, ordinary output abnormalcy can be coped with, but there is a problem that the conventional voltage regulator cannot handle satisfactorily thermal runaway of the transistor 7 and/or diodes 4 to be caused when the ambient temperature rises for some reason. The above conventional voltage regulator must detect an abnormal stabilized output due to thermal runaway of the transistor 7 and/or diodes 4 before bringing the output of the voltage regulator to a halt and, therefore, protects the regulator a little too late, resulting in quite possible failure to prevent the transistor 7 and/or diodes 4 from being damaged or destroyed.

Thus, an object of this invention is to provide a a switching-type voltage regulator, capable of securely preventing a component part or parts of the regulator such as a switching transistor and a rectification diode from being damaged or destroyed due to a temperature runaway.

SUMMARY OF THE INVENTION

A switching-type voltage regulator of this invention comprises a voltage control section for generating a stabilized voltage by controlling a voltage supply period from input side to output side, and a protective device. The protective device monitors the temperature of a certain component part or parts of the voltage control section and convert the temperature into a voltage to compare with the reference voltage generated by a reference voltage source, and brings the output of the voltage control section to a halt in accordance with the result of comparison.

According to this invention, if the temperature of the component part or parts of the voltage control section being monitored rises above a specified level, the output of the voltage control section can be brought to a halt regardless of the presence of output abnormalcy to securely prevent the aforesaid component part or parts from being damaged or destroyed due to a temperature rise. This is suitable for preventing semiconductor elements such as a switching transistor and a rectification diode from damages or destruction due to thermal runaway.

A monitoring means of this invention may be anything which generates a voltage signal corresponding with the temperature of the component part or parts monitored. But utilization of the fact that the electric characteristic of semiconductor p-n junctions which changes with temperature is preferred, and a semiconductor diode is particularly preferable in view of simple composition and advantageous cost. Forward voltage of a diode decreases with increasing temperature. So, if a diode is arranged near the component part or parts to be monitored and a constant current source is connected therewith, the temperature of the component part or parts is converted into a voltage signal to be output.

For a reference voltage source of this invention, no specific requirements are needed, but anything capable of generating at least one reference voltage may be used freely. Similarly, no specific limits are imposed on composition of the aforesaid comparing means, for which anything capable of comparing at least two voltages and generating a signal corresponding with the result of comparison may be used at will.

As a halting means of this invention, anything which can generate a halting signal in accordance with the result given by the aforesaid comparing means may be used without limitation. It is, however, preferable to use a 2-input AND circuit, where a signal representing the result of the comparing means is inputted into one of the input terminals and a switching control signal into the other of the input terminals to control a switching element in the voltage control section. In this case, at the time of normal operation, if it is so composed that a high level (H) of signal is input from the comparing means, the switching element can be put into operation depending upon a high or low level (H or L) of the switching control signal in the same manner as in a case unequipped with a protective device of this invention. This leads to the simplification of composition. In addition, the halting means may also be installed separately from a device or circuit which controls the switching element.

In a preferred embodiment of this invention, the aforesaid reference voltage source is so composed as to generate a plurality of reference voltages and one is selected out of the generated reference voltages to be inputted into the aforesaid comparing means. And it is so designed that the comparaing means compares the output voltage from the aforesaid monitoring means with the selected reference voltage. In this case, easy selection and alteration of reference voltage magnitude advantageously allow the temperature at which the output of the power supply is brought to a halt to be set from outside easily and the set temperature to be changed externally.

In another preferred embodiment of this invention, a latching means is installed between the aforesaid comparing and the halting means to maintain the halted condition. Once the output of the power supply is brought to a halt by a protective device of this invention, the halted condition is maintained by the latching means even if the output voltage of the aforesaid monitoring means rises subsequently. Hence, this protective device advantageously continues its stabilized operation despite any fluctuation of output voltage from the aforesaid monitoring means around the reference voltage.

As the aforesaid latching means, for example, various latching circuits may be used, but a latching circuit having data, gate, and reset terminals is preferable. In this case, it is so designed that the data terminal is kept at a certain level (H or L) and the result given by the aforesaid comparing means is inputted into the gate terminal. And the latching circuit is reset at the time of commencement of operation of the power supply, and the level of the output of the latching circuit is set at the condition for normal operation (H or L). The above measure allows the level of the output signal to be inverted as the level of the signal inputted into the data terminal is inverted with increasing temperature. Since this condition of inverted output signal cannot be cancelled unless reset, the operation of the power supply will never be restored to a normal state even if the level of the input signal to the data terminal is subsequently inverted again.

DESCRIPTION OF THE PREFERRED EMBODIMENTS

Preferred embodiments of this invention will be described below by referring to FIGS. 2 and 3.

FIRST EMBODIMENT

Figure 1:
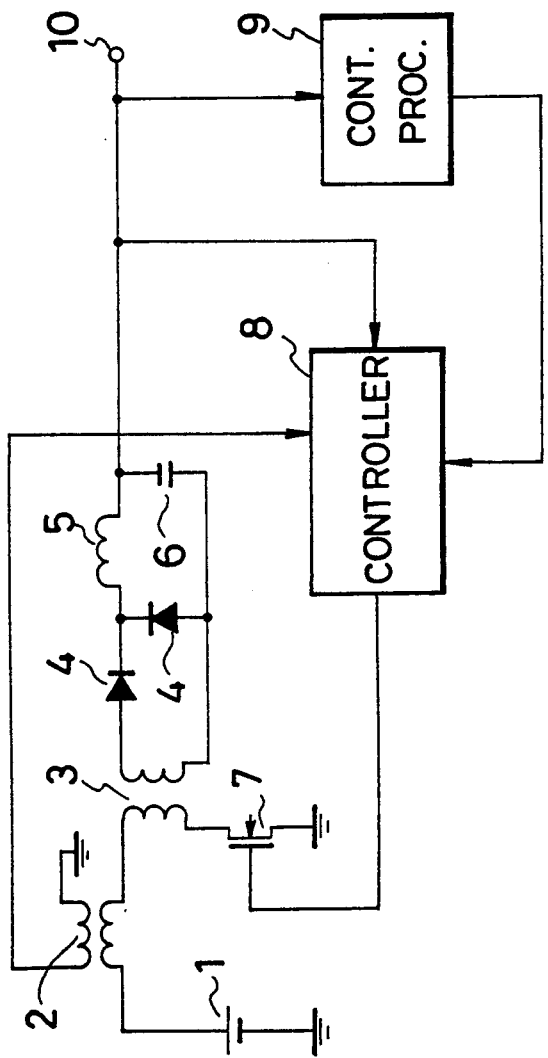
FIG. 1 shows a circuit block diagram of a conventional switching-type voltage regulator provided with a protective device.
Figure 2:
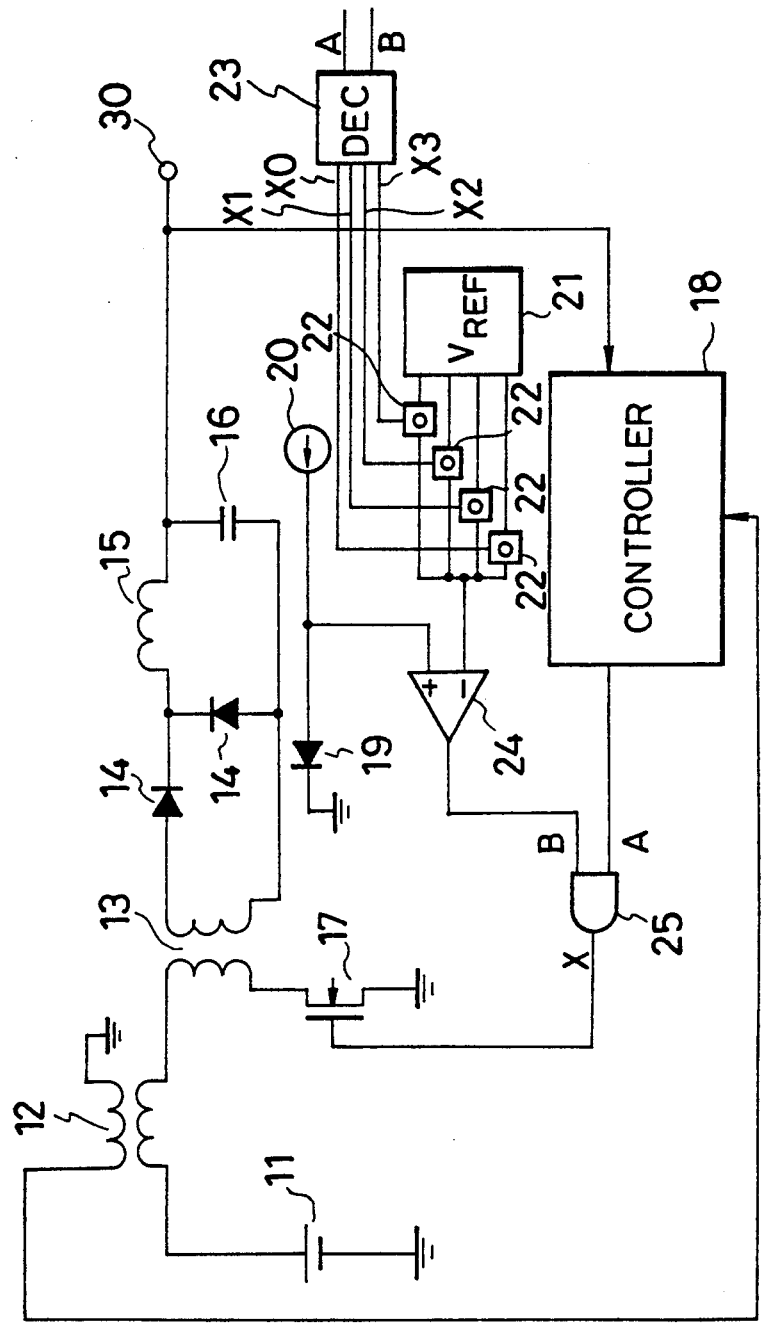
FIG. 2 shows a circuit block diagram of a switching-type voltage regulator provided with a protective device according to the first embodiment of this invention.

FIG. 2 shows a switching-type voltage regulator provided with a protective device. This voltage regulator has the same voltage regulation mechanism as in the above-mentioned conventional voltage regulator: i.e., a non-stabilized input voltage source 11 on the primary side, a transformer 12 which generates a signal for detecting a primary-side overcurrent, an output transformer 13 which divides the secondary side from the primary side, two diodes 14 which full-wave rectify a secondary-side current, a choking coil 15 and a capacitor 16 which smooth the secondary-side current to produce a constant voltage at an output terminal 30, a MOS transistor 17 which controls a primary-side current by switching, and a control circuit 18 which receives an output voltage at the output terminal 30 and detects deviation from a set voltage to stabilize the output voltage. The control circuit 18 acts in the same manner as conventional to modulate pulse width of the primary-side current in accordance with the output voltage deviation from the set voltage and control the primary-side current via a change in on-of interval of the switching transistor 17. The control circuit 18 also detects the primary-side overcurrent with the transformer 12 to control the primary-side current in a similar manner.

In this embodiment, to prevent thermal runaway of the switching transistor 17 and/or rectification diodes 14 due to a temperature rise is installed a protective device composed of a monitoring diode 19, a constant current source 20, a reference voltage source 21, analogue switches 22, a decoder 23, a comparator 24, and a halting circuit 25. The monitoring diode 19 is arranged near the rectification diodes 14 and transistor 17 to monitor their temperatures. One end of the monitoring diode 19 is connected to the constant current source 20 and the other end of the monitoring diode 19 grounded. To the diode 19 in operation, a constant direct current is supplied. Since, in general, a forward voltage fall (internal resistance) of a diode made of, e.g., silicon characteristically decreases with increasing temperature, the diode 19 provides voltage signals corresponding with the temperature of the rectification diodes 14 and transistor 17. The temperature of the rectification diodes 14 and transistor 17 can, therefore, be easily monitored by detecting the voltage difference across the diode 19.

The reference voltage source 21 here outputs four reference voltages: 0.4 V, 0.5 V, 0.6 V, and 0.7 V. Each of the four lines through which these reference voltages are transmitted to the comparator 24 is provided with an analogue switch 22 installed between the reference voltage source 21 and comparator 24. The analogue switches 22 act to open when a high level (H) of control signals are input and to close when a low level (L) of control signals are input. These analogue switches 22 are controlled by the decoder 23.

The decoder 23 has two input terminals A and B as well as four output terminals X0, X1, X2, and X3 with these output terminals X0, X1, X2, and X3 being connected to the analgue switches 22 in the aforesaid four reference voltage lines respectively. Depending upon the contents of the signals input into the terminals A and B, a high or low level (H or L) of control signal are sent to each of the analogue switches 22 to control on-off operation of each analogue switch 22. In thisway, one reference voltage is selected out of the four.

The decoder 23 operates as shown in the truth table of Table 1. As seen from Table 1, when the both input terminals A and B are on the L level, reference voltage 0.4 V is selected as only the output terminal X0 becomes the H level to open the analogue switch 22 for the line of reference voltage 0.4 V. When the input terminal A is on the L level and the input terminal B is on the H level, only the output terminal X1 becomes the H level to select reference voltage 0.5 V in a similar manner. Similarly, when the input terminal A is on the H level and the input terminal B on the L level, only the output terminal X2 becomes the H level to select reference voltage 0.6 V and when the both input terminals A and B are on the H level, only the output terminal X3 becomes the H level to select reference voltage 0.7 V. In this embodiment, with the H level of the input terminals A and B corresponded to "1" and the L level to "0", the inputs are expressed by a 2-digit binary number and it is so designed that the order of the reference voltage selected increases with increasing value of such a number.

TABLE 1

| A | B | X0 | X1 | X2 | X3 |
|---|---|----|----|----|----|
| L | L | H  | L  | L  | L  |
| L | H | L  | H  | L  | L  |
| H | L | L  | L  | H  | L  |
| H | H | L  | L  | L  | H  |

The reference voltage selected by the decoder 23 and the analogue switches 22 is inputted into the (−) terminal of the comparator 24, while the signal voltage obtained from the monitoring diode 19 is inputted into the (+) terminal of the comparator 24. The comparator 24 compares these two voltages to output a L-level signal into the terminal B of the halting circuit 25 when the signal voltage from the monitoring diode 19 is lower than the reference voltage selected or the temperature of the rectification diodes 14 and transistor 17 being monitored is higher than a predetermined level. When the signal voltage of the monitoring diode 19 is higher than or equal to the reference voltage selected, the temperature of the rectification diodes 14 and transistor 17 is deemed at or below the predetermined level and a H-level signal is outputted.

The control signal of the transistor 17 from the control circuit 18 is inputted into the input terminal A of the halting circuit 25. The halting circuit 25 operates on the principle of AND logic and outputs a H-level signal from the output terminal X only when the H-level signal is simultaneously inputted into the both input terminals A and B from the comparator 24 and control circuit 18. This turns on (opens) the transistor 17. If a L-level signal is inputted into either input terminals A or B, the halting circuit 25 outputs a L-level signal to turn off (close) the transistor 17.

The protective device having the above composition operates as follows: For example, in an assumed case where the minimum reference voltage 0.4 V is selected, this reference voltage is inputted into the (−) terminal of the comparator 24. Then, when the signal voltage inputted into the (+) terminal of the comparator 24 from the monitoring diode 19 is 0.4 V or more, or the temperature of the rectification diodes 14 and transistor 17 is equal to or lower than the temperature corresponding with the reference voltage 0.4 V, the comparator 24 outputs a H-level signal to the halting circuit 25. The then on-off operation of the transistor 17, therefore, depends upon whether the control signal voltage from the control circuit 18 is H-level or L-level. Thus, if the control signal voltage is H-level, the halting circuit 25 outputs a H-level signal to turn on the transistor 17, and if the control signal voltage is H-level, the halting circuit 25 outputs a L-level signal to turn off the transistor 17. The operation at that time is the same as in a case unequipped with the protective device of this invention.

Next, when temperature rises for some reason and the signal voltage sent from the monitoring diode 19 dropped below 0.4 V, the comparator 24 outputs a L-level signal to the halting circuit 25. As a result, the transistor 17 is always turned off as the halting circuit 25 operating on the principle of AND logic always outputs a L-level signal regardless of the input signal from the control circuit 18. The turned-off condition remains even if the input signal from the control circuit 18 becomes H-level. This ensures the halting of voltage regulation operation (output) to securely prevent thermal runaway of the switching transistor 17 and rectification diodes 14.

SECOND EMBODIMENT

Figure 3:
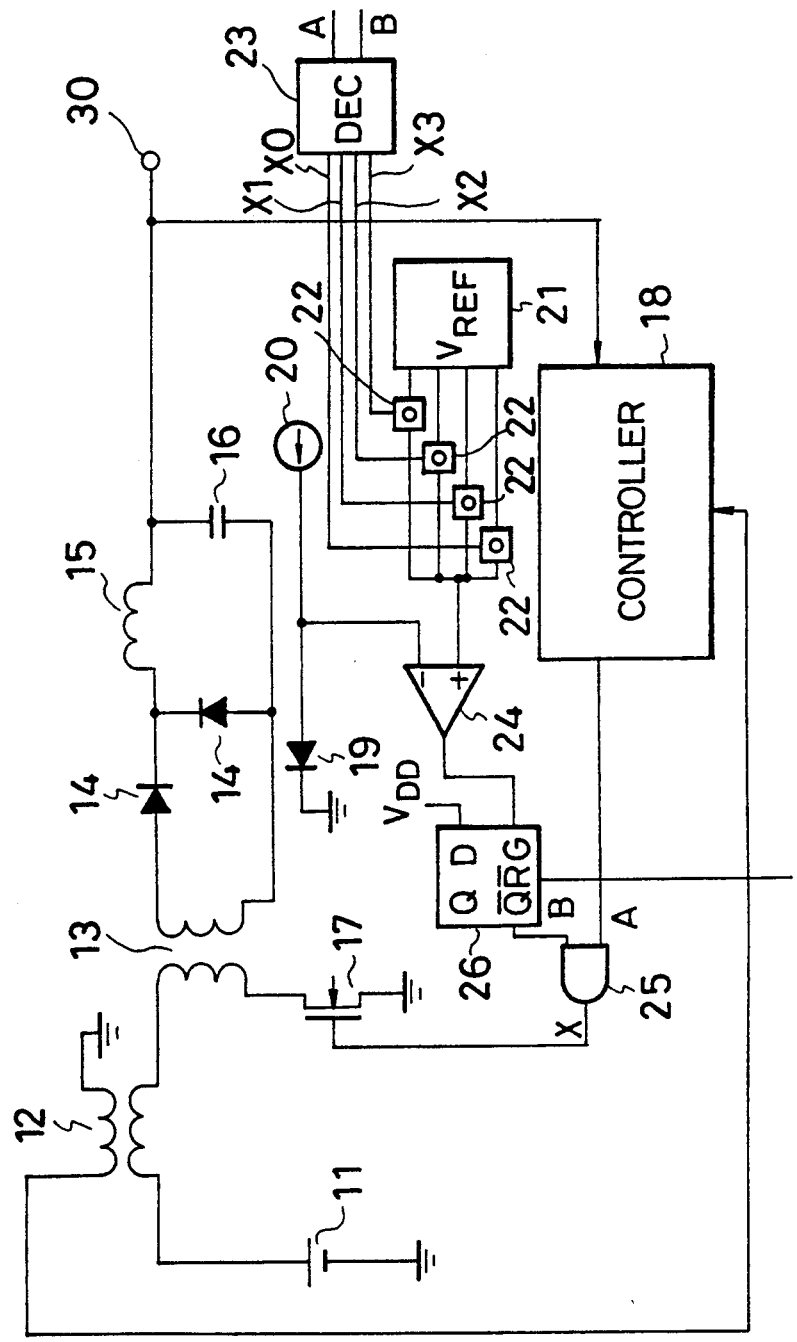
FIG. 3 shows a circuit block diagram of a switching-type voltage regulator provided with a protective device according to the second embodiment of this invention.

FIG. 3 shows a switching type voltage regulator provided with another type protective device. The voltage regulator of the second embodiment has the same composition as the first embodiment except in that the input of the comparator 24 is inverted, or the output of the monitoring diode 19 is inputted into the (−) terminal of the comparator 24 and the output of the control circuit 18 is inputted into the (+) terminal, and in that a latching circuit 26 is installed between the comparator 24 and halting circuit 25.

The halting circuit 26 has a data input terminal D, a gate input terminal G, and an inversion resetting input terminal $\overline{R}$ as well as two output terminals Q and $\overline{Q}$. The output of the comparator 24 is inputted into the gate input terminal G, and a voltage source VDD is connected to the data input terminal D. And only the inverted output terminal $\overline{Q}$ is connected to the input terminal B of the halting circuit 25. The voltage supplied by the voltage source VDD is maintained to constantly keep the data input terminal D on the H level. The latching circuit 26 operates as shown in the truth table of Table 2.

TABLE 2

| D | G | $\overline{R}$ | Q | $\overline{Q}$ |
|---|---|---|---|---|
| H | H | H | H | L |
| L | H | H | L | H |
| — | L | H | latch | latch |
| — | — | L | L | H |

As seen from Table 2, if the latching circuit 26 is reset with the resetting input terminal $\overline{R}$ on the L level, the output terminal Q becomes L-level and the inverted output terminal $\overline{Q}$ becomes H-level. At that time, the condition of the both output terminals Q and $\overline{Q}$ is independent of the data input terminal D and gate input terminal G. During normal operation of the voltage regulator, the comparator 24 outputs a L-level signal to the gate input terminal G. This maintains the reset condition, allowing the output terminal Q to remain on the L level and the inverted output terminal $\overline{Q}$ on the H level. The condition of the both output terminals Q and $\overline{Q}$ is independent of the data input terminal D. If the temperature rises and the signal voltage from the monitoring diode 19 drops below the reference voltage selected, the gate input terminal G becomes H-level. As a result, the output terminal Q is inverted to the H level and the inverted output terminal $\overline{Q}$ to the L level. This condition is maintained even if the gate input terminal G becomes L-level subsequently for some reason.

In the voltage regulator with the protective device according to the second embodiment, the latching circuit 26 is reset and the inverted output terminal $\overline{Q}$ is turned into the H level before starting the operation. After the operation is started, the latching function maintains the inverted output terminal $\overline{Q}$ or the input terminal B of the halting circuit 25 on the same H level as long as the temperature of the transistor 17 and rectification diodes 14 is equal to or lower than the temperature corresponding with the reference voltage selected. Hence, the regulator operates normally by the switching control signal of the control circuit 18.

If a temperature rise turns the output of the comparator 24 or the gate input terminal G to the H level, the inverted output terminal $\overline{Q}$ is inverted to the L level. As a result, the input terminal B of the halting circuit 25 becomes L-level to turn off the transistor 17. This condition is maintained as long as no resetting signal is inputted to the terminal $\overline{R}$ even if the gate input G subsequently becomes L-level for some reason. This eliminates unstable operation due to fluctuation of the signal voltage from the monitoring diode 19.

As a voltage regulation mechanism of this invention, anything which controls the output to obtain a stabilized voltage by switching a switching element may be used without specific limitation to the composition exemplified by the embodiments here.

As described above, in the switching type voltage regulator with the protective device according to the above-mentioned embodiments, the temperature of the transistor 17 and rectification diodes 14 is monitored and the voltage regulation operation immediately ceases to output if the temperature exceeds the predetermined level. Therefore, semiconductor elements such as the seitching transistor 17 can be securely prevented from causing thermal runaway.

This thus eliminates occurrence of abnormalcy in the voltage regulator due to a temperature rise. Moreover, available selection out of a plurality of reference voltages in accordance with working conditions permits easy external setting of the temperature at which the protective device starts to operate as well as easy alteration of such a set temperature.

What is claimed is:

1. A switching-type voltage regulator with a protective device, which has a voltage control section for generating a stabilized voltage by controlling a voltage supply period from an input side to an output side, said protective device comprising:

monitoring means for monitoring a temperature of a component part of said voltage control section and for outputting a signal voltage corresponding to the monitored temperature;

said monitoring means having a monitoring device which is disposed near a component part of said regulator and which detects the temperature of said component part;

a reference voltage source which generates at least one reference voltage;

comparing means for comparing a signal voltage generated by said monitoring means with at least one reference voltage generated by said reference voltage source and for outputting a resulting signal; and halting means for halting an output of said voltage regulator in accordance with said resulting output signal of said comparing means.

2. A voltage regulator as claimed in claim 1, wherein said monitoring device is a semiconductor device having a p-n junction.

3. A voltage regulator as claimed in claim 2, wherein said monitoring device is a semiconductor diode.

4. A voltage regulator as claimed in claim 1, wherein said reference voltage source is capable of providing a plurality of different reference voltages, and selecting means for selecting one of said plurality of reference voltages, said comparing means making said comparison with said selected reference voltage.

5. A voltage regulator as claimed in claim 4, wherein said selecting means comprises at least one analogue switch for switching lines to said reference voltages.

6. A voltage regulator as claimed in claim 5, and a decoder which generates a control signal in accordance with a logical state of an input signal, said analogue switch being controlled by said decoder.

7. A voltage regulator as claimed in claim 6, wherein there are a plurality of said analogue switches for said plurality of different reference voltages, and said decoder has a plurality of outputs, one of said decoder being set to a first logical state to close a corresponding one of said analogue switches in accordance with logical states of input signals to said decoder, whereby one of said plurality of reference voltages is supplied to said comparing means.

8. A voltage regulator as claimed in claim 1, wherein said monitoring device is supplied with a constant current, and a voltage drop generated by said monitoring device is compared with said reference voltage.

9. A voltage regulator as claimed in claim 2, wherein said monitoring device is supplied with a constant current, and said comparing means compares a voltage drop generated by said monitoring device with said reference voltage.

10. A voltage regulator as claimed in claim 9, wherein said halting means comprises a logic circuit having an AND logic, and means responsive to said voltage drop being larger than a predetermined voltage value for activating said halting means to halt said output of said voltage regulator in response to said logic circuit.

11. A voltage regulator as claimed in claim 9, wherein said halting means comprises a logic circuit having a 2-input AND-logic, and a resulting signal responsive to a signal from said comparing means inputted into one of input terminals of said logic circuit and to a switching control signal input to the other of said input terminals for controlling a switching element for generating a stabilized voltage.

12. A voltage regulator as claimed in claim 9, and latching means for maintaining a halted condition of said voltage regulator, said latching means being provided between said comparing means and said halting means.

13. A voltage regulator as claimed in claim 12, wherein said latching means has a reset terminal and said halted condition is inverted only in response to a reset signal being input into said reset input terminal.

14. A voltage regulator as claimed in claim 13, wherein said latching means has a data input terminal and a gate input terminal, and a constant voltage is supplied to said data input terminal and an output signal of said comparing means is supplied to said gate input terminal.

15. A voltage regulator as claimed in claim 8, and a plurality of said analogue switches for generating a plurality of different reference voltages, and said decoder has a plurality of outputs, one of said outputs of said decoder being set to a first logical state to close one of said analogue switches in accordance with the logical states of input signals to said decoder, whereby one of said reference voltages is supplied to said comparing means.

* * * * *